United States Patent
Lee

(10) Patent No.: US 7,315,472 B2
(45) Date of Patent: Jan. 1, 2008

(54) NON-VOLATILE MEMORY DEVICE

(75) Inventor: Hee Youl Lee, Icheon-si (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/420,367

(22) Filed: May 25, 2006

(65) Prior Publication Data

US 2007/0047366 A1    Mar. 1, 2007

(30) Foreign Application Priority Data

Aug. 29, 2005  (KR) ..................... 10-2005-0079239

(51) Int. Cl.
*G11C 16/02*  (2006.01)
*G11C 8/12*   (2006.01)
*G11C 8/14*   (2006.01)
*G11C 5/06*   (2006.01)

(52) U.S. Cl. .................. 365/185.17; 365/185.05; 365/185.11; 365/185.13

(58) Field of Classification Search ........... 365/185.11, 365/185.17, 230.03, 185.05, 185.13, 185.06
See application file for complete search history.

(56) References Cited

U.S. PATENT DOCUMENTS

| | | | | |
|---|---|---|---|---|
| 5,473,563 A * | 12/1995 | Suh et al. .............. | 365/185.13 |
| 5,650,961 A * | 7/1997 | Himeno et al. ........ | 365/185.17 |
| 5,740,107 A * | 4/1998 | Lee ....................... | 365/185.11 |
| 5,937,424 A * | 8/1999 | Leak et al. ............ | 711/103 |
| 5,940,321 A * | 8/1999 | Takeuchi et al. ....... | 365/185.17 |
| 5,963,475 A * | 10/1999 | Choi et al. ............. | 365/185.11 |
| 6,031,764 A * | 2/2000 | Imamiya et al. ........ | 365/185.29 |
| 6,097,666 A * | 8/2000 | Sakui et al. ........... | 365/230.06 |
| 6,262,926 B1 * | 7/2001 | Nakai ..................... | 365/200 |
| 6,370,062 B2 * | 4/2002 | Choi ....................... | 365/185.23 |
| 6,862,223 B1 * | 3/2005 | Lee et al. ............... | 365/185.33 |
| 2005/0018489 A1 * | 1/2005 | Hosono .................. | 365/185.29 |

FOREIGN PATENT DOCUMENTS

| | | |
|---|---|---|
| JP | 11-177071 A | 7/1999 |
| JP | 2000-222895 A | 8/2000 |
| KR | 2005-0035097 A | 4/2005 |
| KR | 2006-0075361 A | 7/2006 |

* cited by examiner

*Primary Examiner*—Jung (John) H. Hur
(74) *Attorney, Agent, or Firm*—Marshall, Gerstein & Borun LLP

(57) ABSTRACT

A non-volatile memory device may include a plurality of memory blocks including memory cells connected in series to bit lines, respectively. Each of the plurality of memory blocks may include a first sub memory block having a first group of memory cells, which are respectively connected in series between first select transistors connected to the bit lines, respectively, and second select transistors connected to a common source line, and a second sub memory block having a second group of memory cells, which are respectively connected in series between third select transistors connected to the bit lines, respectively, and fourth select transistors connected to the common source line.

20 Claims, 8 Drawing Sheets

FIG. 3A
(PRIOR ART)
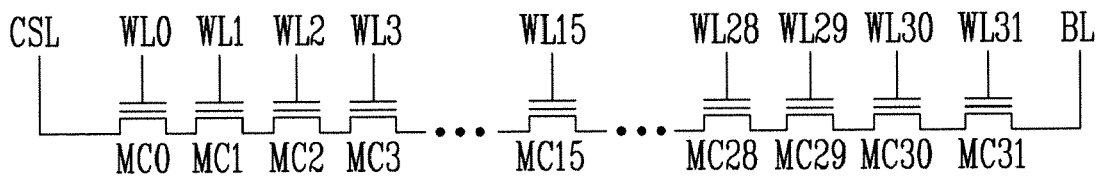
FIG. 3B
(PRIOR ART)
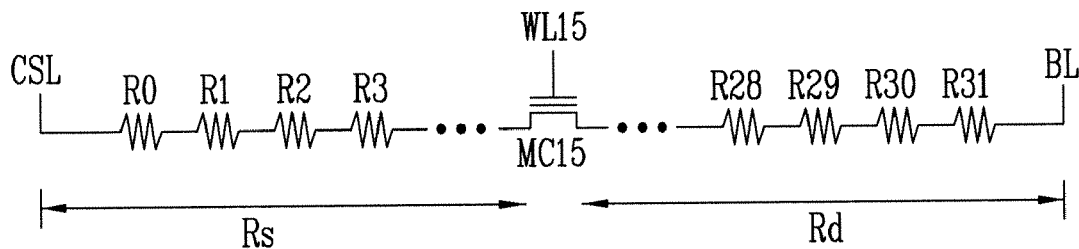
FIG. 3C
(PRIOR ART)

FIG. 7

|  | ERASE | PROGRAM | READ |
|---|---|---|---|
| SELECT BL | Floating | 0V | 1V |
| NON-SELECTED BL | Floating | Vcc | 0V |
| 1SBLK { DSL1 | Floating | Vcc | Vread |
| SELECT WL | 0V | Vpgm | 0V |
| NON-SELECTED WL | 0V | Vpass | Vread |
| SSL1 | Floating | 0V | Vread |
| CSL | Floating | Vcc | 0V |
| 2SBLK { DSL2 | Floating | Floating | 0V |
| WL | 0V | Floating | Floating |
| SSL2 | Floating | Floating | 0V |
| BULK | 20V | 0V | 0V |

NON-VOLATILE MEMORY DEVICE

BACKGROUND

1. Technical Field

This patent relates to non-volatile memory devices, and more particularly, to NAND flash memory devices in which one memory block is divided into two sub memory blocks.

2. Discussion of Related Art

A flash memory is a kind of a non-volatile memory in which data can be stored even after power is turned off. The flash memory can be electrically programmed and erased and does not need the refresh function of rewriting data at regular intervals. The term "program" refers to the operation of programming data into the memory cells, and the term "erase" refers to the operation of erasing data from the memory cells.

The flash memory device may be generally classified into NOR flash memory devices and NAND flash memory devices depending on the structure of the cell and operation conditions. In the NOR flash memory device, the source of each memory cell transistor is connected to the ground terminal (VSS) and program and erase for a predetermined address are possible. Accordingly, the NOR flash memory has been mainly used for application fields requiring the high-speed operation. On the other hand, in the NAND flash memory, a plurality of memory cell transistors are connected in series to form a string. One string is connected to the source and the drain of the transistor. The NAND flash memory has been mainly used for high integration data retention fields.

FIG. 1 is a block diagram of memory blocks of a general NAND flash memory device. The NAND flash memory device as shown in FIG. 1 includes memory blocks (i.e., a basic unit of a number of erase operations). In FIG. 1, "BLK<0:n>" indicates the memory block, "BSW<0:n>" indicates a block select switch unit for selecting the memory blocks, and "BSE<0:n>" indicates a block select signal for driving the block select switch unit.

FIG. 2 is a circuit diagram of one memory block consisting of a number of strings.

Referring to FIG. 2, the number of memory cells connected in series between a drain select transistor DST and a source select transistor SST may be 16, 32, 64 or the like considering device and density. Furthermore, a structure in which the two select transistors DST, SST and a plurality of memory cells between the select transistors are connected in series is called a "string". The drain select transistor DST of the two select transistors is connected to a bit line BL and the source select transistor SST thereof is connected to a common source line CSL.

In general, if the number of memory cells is 32, it is called "32 cell stings". If the number of memory cells is 64, it is called "64 cell stings". If the number of memory cells is 16, it is called "16 cell stings". The number of the memory cells within the memory block may be varied depending on an application. In a product group having the density of 1 G bits or more, 32-cell stings becomes the basis. The flash memory cell basically retains the resistor if it is turned on in the same manner as a general transistor.

FIG. 3a shows a 32-cell sting structure. FIG. 3b shows transistors within the 32-cell sting as resistors. FIG. 3c shows that if a current of 10 μA flows when the bit line BL (drain) is applied with 1V and the gate is applied with a read voltage (Vread=3.5V), a corresponding cell serves as a resistor of 100 Kohm.

As shown in FIG. 3a, even when one selected cell is read in the 32-cell string in which 32 cells are connected in series, current flows through the entire cells constituting the string. In this case, as shown in FIG. 3b, the entire 31 cells other than one read cell operate as resistors. For example, when reading data of cells connected to the word line WL15, 15 cells MC0 to MC14 connected to the word lines WL0 to WL14 become a source-side resistor Rs, and 16 cells MC16 to MC31 connected to the word lines WL16 to WL31 become a drain-side resistor Rd.

In this case, the drain-side resistor Rd functions to drop the bias of the bit line BL, reducing the current level of the linear region. The source-side resistor Rs functions to increase the bias of the common source CSL, reducing the current of the linear region and the saturation region like the back-bias effect. Accordingly, as the cell continues to shrink, the cell current of 32 strings abruptly reduces.

Furthermore, in the string including cells selected during the program operation, a high word line bias (Vpass for by-pass is applied during the program time*31. Therefore, there is a high possibility that a cell state may be changed due to pass disturb in which erase cells are shallowly programmed.

In addition, even in non-selected strings, there is a high possibility that fail may occur due to program disturb in the memory cell MC0 connected to the outermost word line (for example, WL0) during (the program time*31)+the program time.

Furthermore, threshold voltage distributions of a program cell may be increased depending on variation in the threshold voltage of other cells within the same string.

SUMMARY OF THE INVENTION

A herein described embodiment increases a cell current by reducing channel resistors without changing the number of cells within a block, by dividing one memory block into two sub memory blocks.

Another herein described embodiment improves pass disturb occurring in a selected string and program disturb occurring in non-selected strings by reducing a time taken to apply a bias to non-selected word lines during the program operation.

A non-volatile memory device may include a plurality of memory blocks including memory cells connected in series to bit lines, respectively. Each of the plurality of memory blocks may include a first sub memory block having a first group of memory cells, which are respectively connected in series between first select transistors connected to the bit lines, respectively, and second select transistors connected to a common source line, and a second sub memory block having a second group of memory cells, which are respectively connected in series between third select transistors connected to the bit lines, respectively, and fourth select transistors connected to the common source line.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 3a to 3c are views showing transistors within 32 cell stings shown in FIG. 1 as resistors;

FIG. 7 is a table illustrating voltages applied to signal lines during the erase, program, and read operations when a first sub memory block shown in FIGS. 5 and 6 is selected.

DETAILED DESCRIPTION OF EMBODIMENTS

Figure 1:
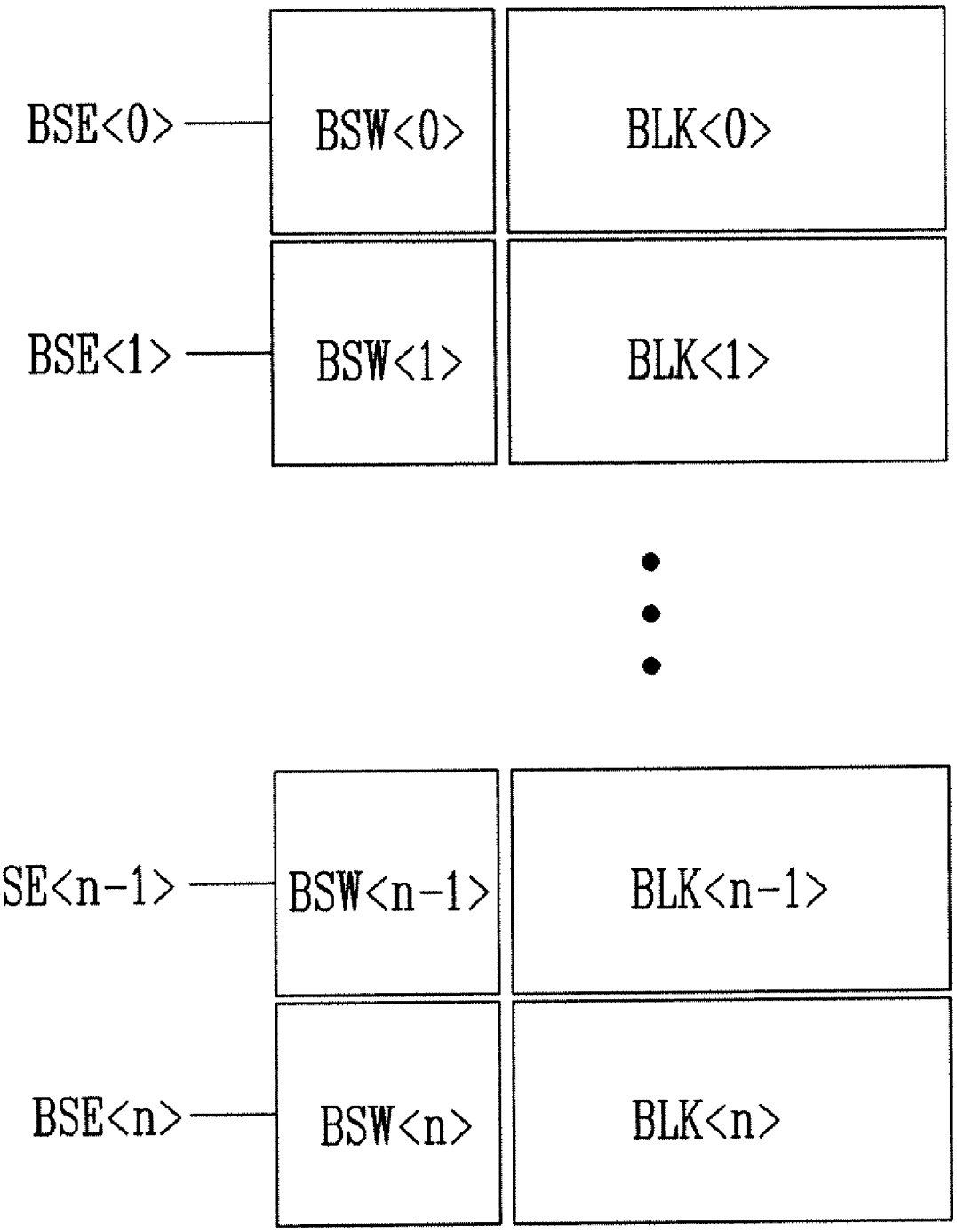
FIG. 1 is a block diagram of memory blocks of a non-volatile memory device in the related art.
Figure 2:
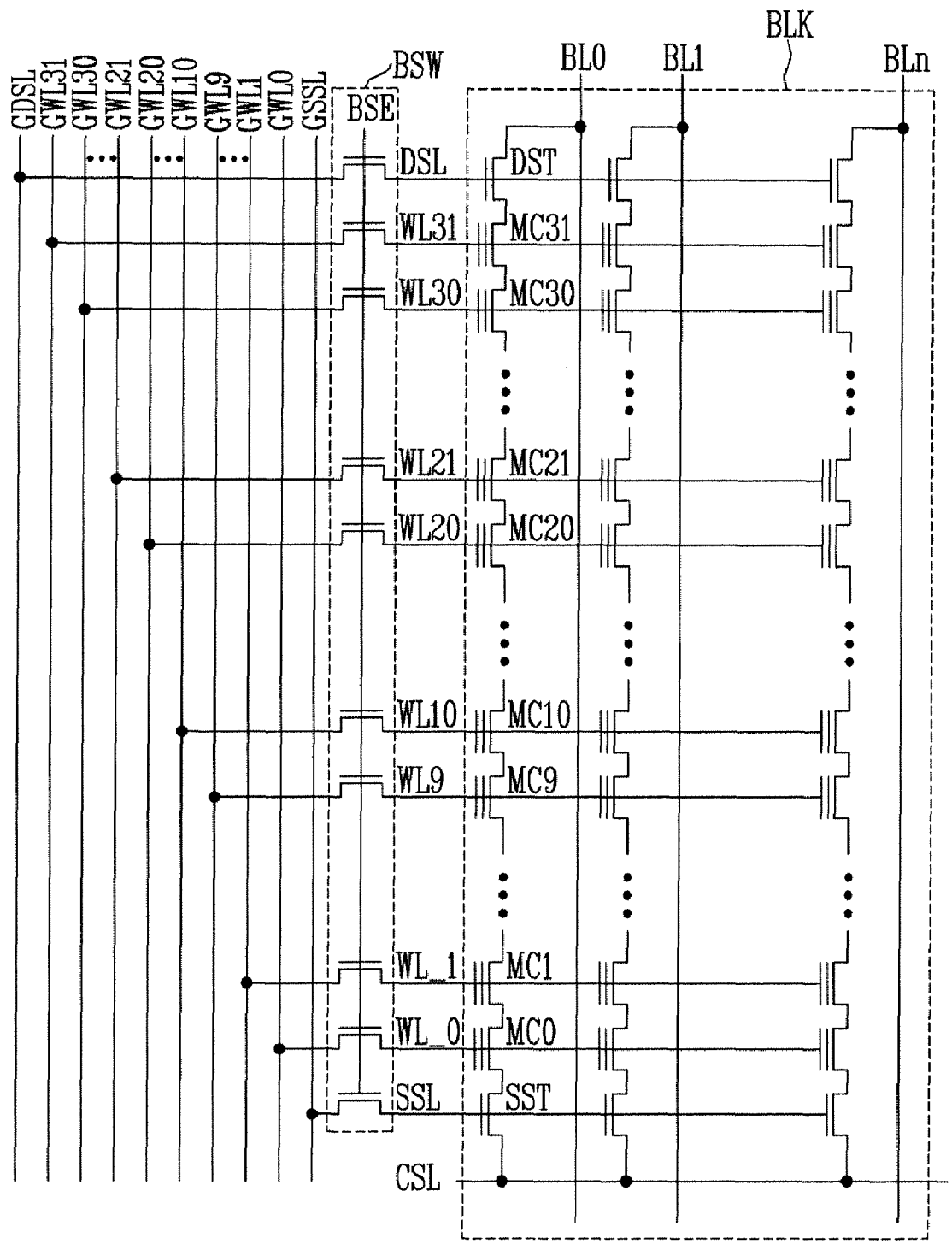
FIG. 2 is a circuit diagram of one memory block shown in FIG. 1.

In the following detailed description, only certain exemplary embodiments of the present invention have been shown and described simply by way of illustration. As those skilled in the art will realize, the described embodiments may be modified in various different ways, all without departing from the spirit or scope of the present invention. Accordingly, the drawings and description are to be regarded as illustrative in nature and not restrictive. Like reference numerals designate like elements throughout.

Figure 4:
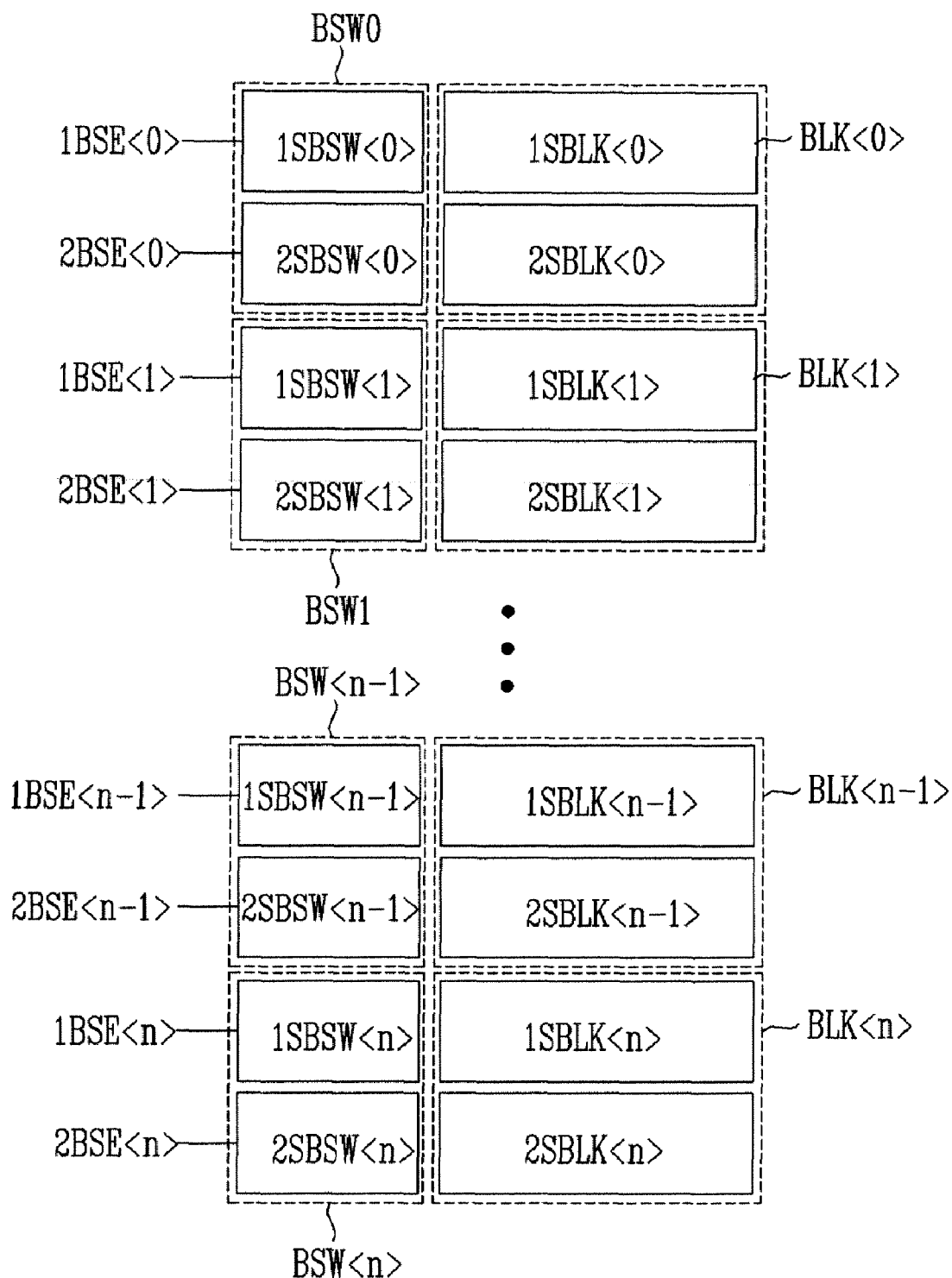
FIG. 4 is a block diagram of memory blocks of a non-volatile memory device according to a described embodiment.

FIG. 4 is a block diagram of memory blocks of a non-volatile memory device.

Referring to FIG. 4, one completed memory block (for example, BLK<0>) is divided into two sub memory blocks 1SBLK<0>, 1SBLK<0> unlike the related art. The reason why one block is divided into two sub memory blocks as described above is for reducing the cell current by reducing the number of channel resistor.

Basically, both the two sub memory blocks 1SBLK<0>, 1SBLK<0> within one memory block (for example, BLK<0>) or one of them may be driven through two sub block select switch units 1SBSW<0>, 2SBSW<0>. The sub block select switch units 1SBSW<0:n>, 2SBSW<0:n> are driven according to block select signals (1BSE<0:n>, 2BSE<0:n>), respectively.

Figure 5:
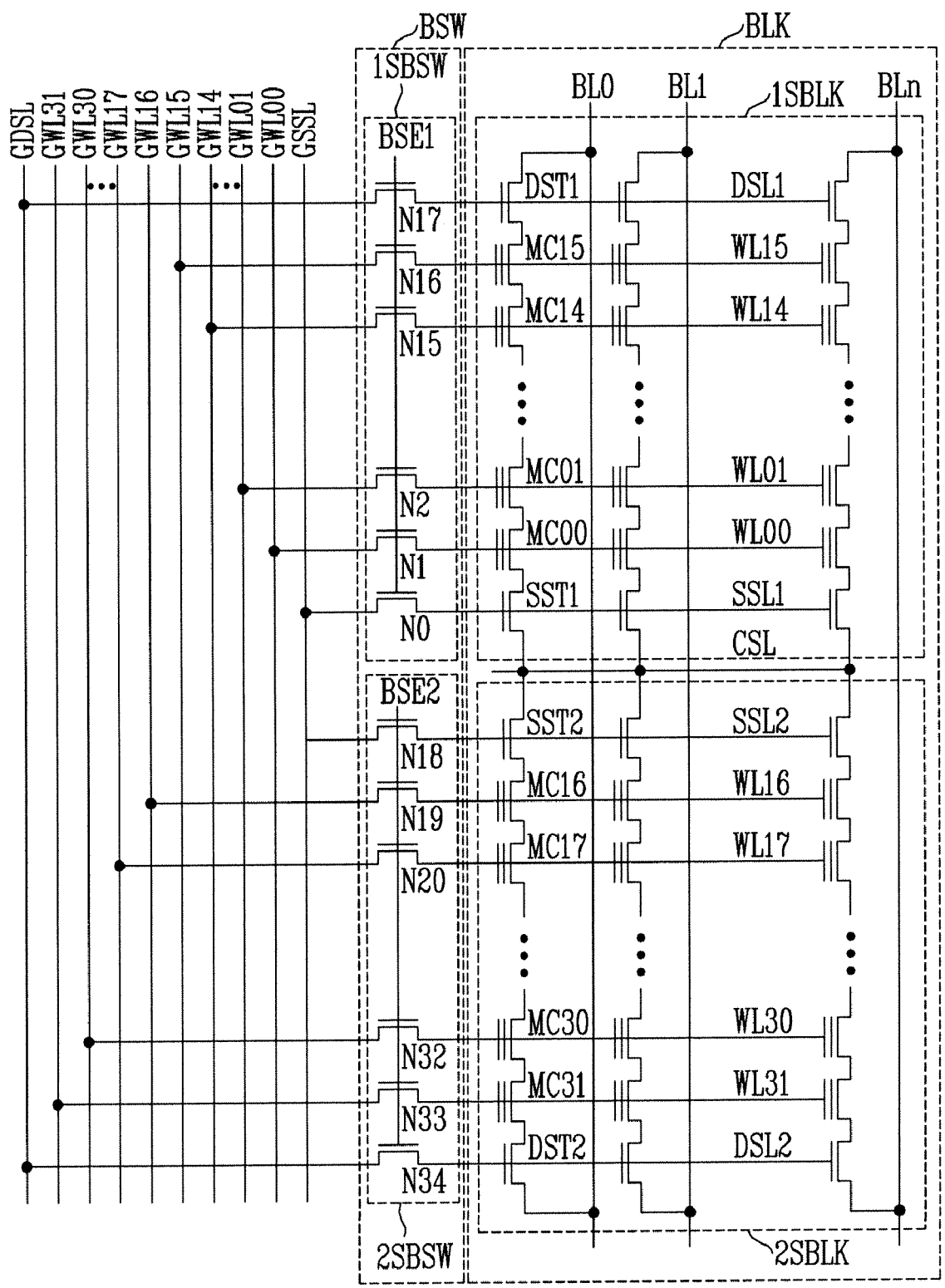
FIGS. 5 and 6 are circuit diagrams of one memory block shown in FIG. 4.

As one completion type memory block is divided into two sub memory blocks, sub memory blocks 1SBLK, 2SBLK share one common source line CSL, and each of the sub memory blocks includes 16 cell strings having drain and source select transistors DST, SST, as shown in FIG. 5.

Figure 6:
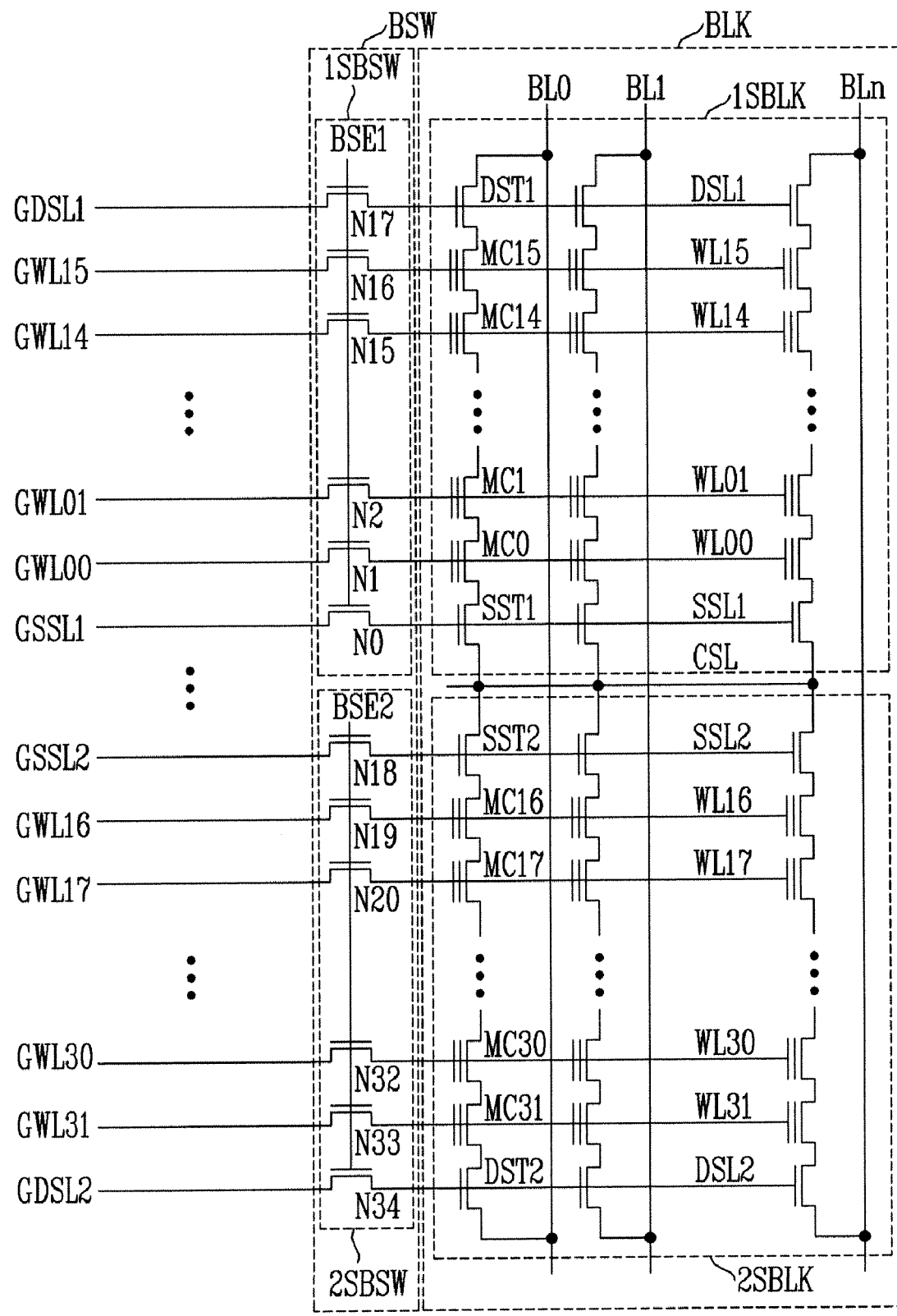

FIGS. 5 and 6 show one memory block including a number of strings.

Referring to FIG. 5, the memory block BLK includes the first and second sub memory blocks 1SBLK, 2SBLK. A block select switch unit BSW includes first and second sub block select switch units 1SBSW, 2SBSW. The first sub block select switch unit 1SBSW includes a plurality of NMOS transistors N0 to N17. The second sub block select switch 2SBW also includes a plurality of NMOS transistors N18 to N34.

The first sub memory block 1SBLK includes drain select transistors DST1 whose gates are connected to a first drain select line DSL1 and drains are connected to bit lines BL0 to BLn, respectively, source select transistors SST1 whose gates are connected to a first source select line SSL1 and sources are commonly connected to a common source line CSL, and 16 memory cells MC0 to MC15 which are connected in series between the select transistors DST1, SST1 and have gates connected to word lines WL00 to WL15, respectively.

The second sub memory block 2SBLK includes drain select transistors DST2 whose gates are connected to a second drain select line DSL2 and drains are connected to the bit lines BL0 to BLn, respectively, source select transistors SST2 whose gates are connected to a second source select line SSL2 and sources are commonly connected to the common source line CSL, and 16 memory cells MC16 to MC32 which are connected in series between the select transistors DST2, SST2 and have gates connected to word lines WL16 to WL31, respectively.

The first sub block select switch unit 1SBSW connects the word lines WL00 to WL15 to global word lines GWL00 to GWL15, the first drain select line DSL1 to one global drain select line GDSL, and the first source select line SSL1 to one global source select line GSSL. The second sub block select switch unit 2SBSW connects the word lines WL16 to WL31 to global word lines GWL16 to GWL31, the second drain select line DSL2 to one global drain select line GDSL, and the second source select line SSL2 to one global source select line GSSL. Accordingly, additional global lines are not required.

Referring to FIG. 6, the global source select line GSSL2 and the global drain select line GDSL2 are additionally disposed differently from that of FIG. 5. The sub block select switch unit 1SBSW connects the word lines WL00 to WL15 to the global word lines GWL00 to GWL15, the first drain select line DSL1 to the first global drain select line GDSL1, and the first source select line SSL1 to the first global source select line GSSL1. The second sub block select switch unit 2SBSW connects the word lines WL16 to WL31 to the global word lines GWL16 to GWL31, the second drain select line DSL2 to the second global drain select line GDSL2, and the second source select line SSL2 to the second global source select line GSSL2.

FIG. 7 is a table illustrating voltages applied to signal lines during the erase, program, and read operations when a first sub memory block shown in FIGS. 5 and 6 is selected.

Referring to FIG. 7, in the erase operation, one memory block is selected, and a bias 0V of the global word lines GWL0 to GWL31 is transferred to the word lines WL0 to WL31 through the two sub block select switch units 1SBSW, 2SBSW. At this time, the bulk is applied with 20V and the remaining lines BL, SSL1, SSL2, DSL1, DSL2, and CSL are floated. In this case, the entire memory cells MC0 to MC31 arranged in the two sub memory blocks 1SBLK, 2SBLK are erased at the same time.

In the erase operation, both first and second block select signals BSE1, BSE2 become high and the NMOS transistors N0 to N34 of the two sub block select switch units 1SBSW, 2SBSW are all turned on. Accordingly, since the entire 32 word lines are applied with 0V, normal block erase is made possible.

As an alternative method of performing the erase operation, only the first block select signal (BSE1) or the first block select signal (BSE2) becomes high and only one of the two sub block select switch units 1SBSW, 2SBSW is driven. Accordingly, only 16 word lines are applied with 0V and half block erase is made possible accordingly. In addition, by dividing one memory block into two sub memory blocks, sub block repair is made possible. Therefore, there is an advantage in that a pad block number can be reduced.

In the program operation, if one block select signal (for example, BSE1) becomes logic high and the NMOS transistors N0 to N17 of the sub block select switch unit 1SBSW are turned on, the first sub memory block 1SBLK is selected. At this time, non-selected word lines (for example, WL1 to WL15) of the first sub memory block 1SBLK are applied with a pass bias (Vpass) for bypass, which is generated from a high voltage generator (not shown) and is loaded onto the global word lines GWL1 to WL15. A selected word line (for example, WL0) is applied with a program bias (Vpgm) loaded onto the global word line GWL0.

The word lines WL16 to WL31 of a non-selected sub memory block (for example, 2SBLK) are not applied with the pass bias (Vpass) because it is unnecessary since the NMOS transistors N18 to N34 of the sub block select switch unit 2SBSW are turned off and the global word lines GWL16 to GWL31 become short accordingly. Since a bias is also not applied to the source select line SSL2 and the drain select line DSL, the word lines WL16 to WL31 and the select lines DSL2, SSL2 are floated.

In this case, a pass bias application time is shortened by half in comparison with the related art. Accordingly, pass disturb caused by the pass bias (Vpass) applied to non-selected word lines during the program operation is also reduced. Consequently, there is an effect in that about 0.45V shift of the threshold voltage (Vt) can be reduced. Furthermore, program disturb occurring in word lines which are the closest to a source select line within a program-prohibit string also has an effect in which about 0.45V shift of the threshold voltage (Vt) is reduced.

In the read operation, in the same manner as the program operation, if one block select signal (for example, BSE1) becomes logic high and the NMOS transistors N0 to N17 of the sub block select switch unit 1SBSW are turned on, the sub memory block 1SBLK is selected. Non-selected word lines (for example, WL1 to WL15) of the selected sub memory blocks 1SBLK are applied with a read voltage (Vread) loaded onto the global word lines GWL1 to WL15, and a selected word line (for example, WL0) is applied with 0V.

At this time, the selected bit line is applied with 1V, the non-selected bit line is applied with 0V, and the select lines DSL1, SSL1 are applied with the read voltage (Vread). Unlike the related art, the word lines WL16 to WL31 of a non-selected sub memory block (for example, 2SBLK) are not applied with the read voltage (Vread) since the NMOS transistors N18 to N34 of the sub block select switch unit 2SBSW are turned off, and are thus floated. The source select line SSL2 and the drain select line DSL2 are applied with 0V.

In this case, a time taken to apply the read bias (Vread) for bypass to non-selected word lines can be shortened by half, and the shift of the threshold voltage of an erase cell by read disturb is also reduced about 0.45V.

Furthermore, if 32 cells are read on a 16-cell basis, the number of channel resistors also reduces by halt that much. Accordingly, a cell current flowing through the bit lines is increased. Since a voltage (V) divided by a resistance (R) is a current (I=V/R), the smaller the resistance, the greater the cell current.

As described above, in 16 cell stings (i.e., a half of 32 cell stings), by reducing the number of channel resistors by ½ or less, a drain bias can be increased and a source bias can be reduced during the read operation. Accordingly, the whole cell current can be increased.

Figure 8:
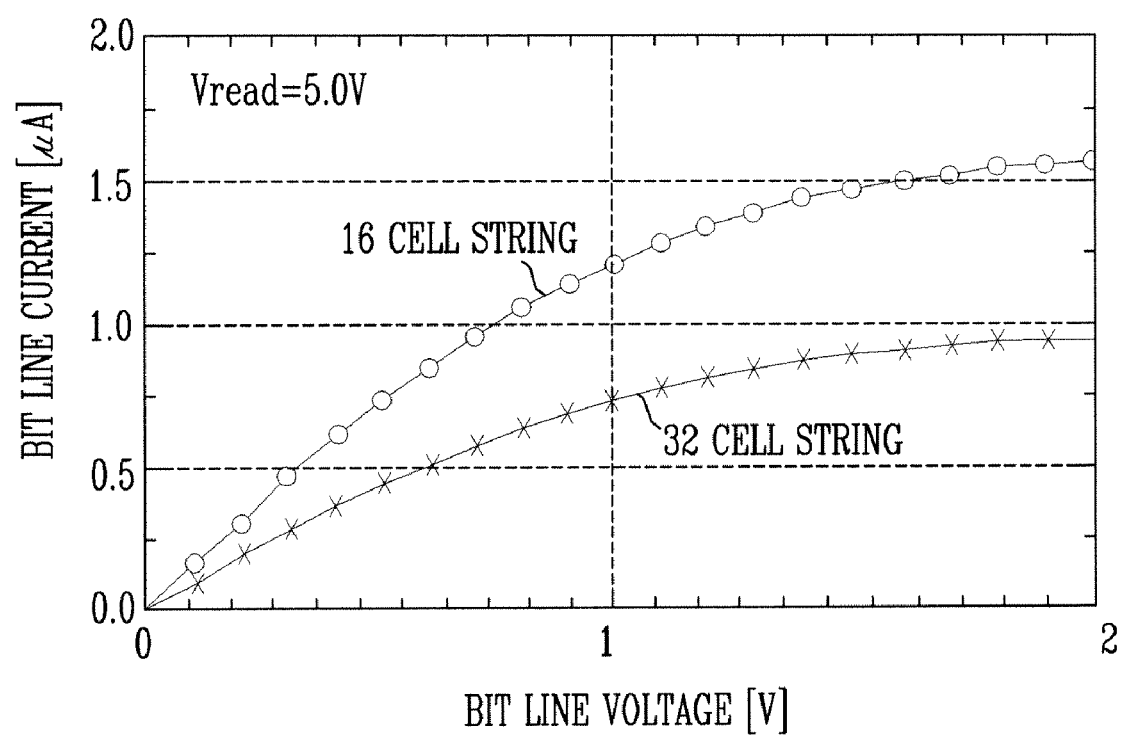
FIG. 8 is a graph illustrating the relationship between a current flowing through the bit lines shown in FIGS. 5 and 6 and a bit line voltage.

FIG. 8 is a graph illustrating the relationship between a current flowing through the bit lines shown in FIGS. 5 and 6 and a bit line voltage.

From FIG. 8, it can be seen that a current is about 60% higher in the 16 cell stings of the embodiment of FIGS. 5 and 6 than in the 32 cell stings of the related art.

As described above, according to an embodiment of the present invention, the number of channel resistors can be reduced, for example by half as compared with the related art while keeping characteristics of a memory block intact. Accordingly, a cell current can be increased, for example by about 60% or more during the read operation compared with the relate art.

Furthermore, according to an embodiment of the present invention, a time taken to apply a bias to word lines connected in series can be shortened by half. It is possible to improve pass disturb and program disturb.

Furthermore, according to an embodiment of the present invention, since the cell current is increased, an evaluation time during the read or program verify operation can be reduced. It is thus possible to reduce a read time and a program time.

In addition, according to an embodiment of the present invention, read disturb occurring in non-selected word lines during the read operation can be prevented. Therefore, the reliability can be improved.

In addition, according to an embodiment of the present invention, since half block repair is possible, the number of bad blocks can be reduced.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A non-volatile memory device comprising:
a plurality of memory blocks each of the memory blocks including memory cells, the memory cells being connected in series to bit lines, respectively, wherein each of the plurality of memory blocks comprises:
a first sub-memory block having a first group of memory cells, which are respectively connected in series between first select transistors connected to the bit lines associated with the first group of memory cells, respectively, and second select transistors connected to a common source line; and
a second sub-memory block having a second group of memory cells, which are respectively connected in series between third select transistors connected to the bit lines associated with the second group of memory cells, respectively, and fourth select transistors connected to the common source line;
wherein memory cells within each memory block are connected to N word lines, the first sub-memory block is connected to 1/2N word lines of the N word lines, and the second sub-memory block is connected to the remaining 1/2N word lines of the N word lines, and
wherein 1/2N word lines of the first sub-memory block and first and second select lines of the first and second select transistors are connected to 1/2N global word lines and first and second global select lines, respectively, through a first sub block select switch unit, and 1/2N word lines of the second sub-memory block and third and fourth select lines of the third and fourth select transistors are connected to the remaining 1/2N global word lines and the first and second global select lines, respectively, through a second sub block select switch unit.

2. The non-volatile memory device as claimed in claim 1, wherein during a program operation, if one of the first and second sub-memory blocks performs the program operation, the other of the first and second sub-memory blocks does not perform the program operation.

3. The non-volatile memory device as claimed in claim 1, wherein during a read operation, if one of the first and second sub-memory blocks performs the read operation, the other of the first and second sub-memory blocks does not perform the read operation.

4. The non-volatile memory device as claimed in claim 1, wherein during an erase operation, if one of the first and second sub-memory blocks performs the erase operation, the other of the first and second sub-memory blocks does not perform the erase operation.

5. The non-volatile memory device as claimed in claim 1, wherein during an erase operation, both the first and second sub-memory blocks perform the erase operation.

6. The non-volatile memory device as claimed in claim 1, wherein during a repair operation, one of the first and second sub-memory blocks is repaired.

7. The non-volatile memory device as claimed in claim 1, wherein if one of the first and second sub-memory blocks is selected by first and second block select signals, 1/2N word lines within a non-selected sub-memory block exist as a floating state and third and fourth select lines of the third and fourth select transistors also exist as a floating state, during a program operation.

8. The non-volatile memory device as claimed in claim 1, wherein if one of the first and second sub-memory blocks is selected by first and second block select signals, 1/2N word lines within a non-selected sub-memory block exist as a floating state and third and fourth select lines of the third and fourth select transistors are applied with 0V, during a read operation.

9. The non-volatile memory device as claimed in claim 1, wherein during program, read and, erase operations, only one of the first and second sub block select switch units is driven, and the other of the first and second sub block select switch units is not driven, whereby only one of the first and second sub-memory blocks is driven and the other of the first and second sub-memory blocks is not driven.

10. The non-volatile memory device as claimed in claim 1, wherein during an erase operation, both the first and second sub block select switch units are driven whereby both the first and second sub-memory blocks are driven.

11. A non-volatile memory device comprising:
a plurality of memory blocks each of the memory blocks including memory cells, the memory cells being connected in series to bit lines, respectively, wherein each of the plurality of memory blocks comprises:
a first sub-memory block having a first group of memory cells, which are respectively connected in series between first select transistors connected to the bit lines associated with the first group of memory cells, respectively, and second select transistors connected to a common source line; and
a second sub-memory block having a second group of memory cells, which are respectively connected in series between third select transistors connected to the bit lines associated with the second group of memory cells, respectively, and fourth select transistors connected to the common source line;
wherein memory cells within each memory block are connected to N word lines, the first sub-memory block is connected to 1/2N word lines of the N word lines, and the second sub-memory block is connected to the remaining 1/2N word lines of the N word lines, and,
wherein 1/2N word lines of the first sub-memory block and first and second select lines of the first and second select transistors are connected to 1/2N global word lines and first and second global select lines, respectively, through a first sub block select switch unit, and
1/2N word lines of the second sub-memory block and third and fourth select lines of the third and fourth select transistors are connected to the remaining 1/2N global word lines and third and fourth global select lines, respectively, through a second sub block select switch unit.

12. The non-volatile memory device as claimed in claim 11, wherein if one of the first and second sub-memory blocks is selected by first and second block select signals, 1/2N word lines within a non-selected sub-memory block exist as a floating state and third and fourth select lines of the third and forth select transistors also exist as a floating state, during a program operation.

13. The non-volatile memory device as claimed in claim 11, wherein if one of the first and second sub-memory blocks is selected by first and second block select signals, 1/2N word lines within a non-selected sub-memory block exist as a floating state and third and fourth select lines of the third and fourth select transistors are applied with 0V, during a read operation.

14. The non-volatile memory device as claimed in claim 11, wherein during program, read and, erase operations, only one of the first and second sub block select switch units is driven, and the other of the first and second sub block select switch units is not driven, whereby only one of the first and second sub-memory blocks is driven and the other of the first and second sub-memory blocks is not driven.

15. The non-volatile memory device as claimed in claim 11, wherein during an erase operation, both the first and second sub block select switch units are driven whereby both the first and second sub-memory blocks are driven.

16. The non-volatile memory device as claimed in claim 11, wherein during a program operation, if one of the first and second sub-memory blocks performs the program operation, the other of the first and second sub-memory blocks does not perform the program operation.

17. The non-volatile memory device as claimed in claim 11, wherein during a read operation, if one of the first and second sub-memory blocks performs the read operation, the other of the first and second sub-memory blocks does not perform the read operation.

18. The non-volatile memory device as claimed in claim 11, wherein during an erase operation, if one of the first and second sub-memory blocks performs the erase operation, the other of the first and second sub-memory blocks does not perform the erase operation.

19. The non-volatile memory device as claimed in claim 11, wherein during an erase operation, both the first and second sub-memory blocks perform the erase operation.

20. The non-volatile memory device as claimed in claim 11, wherein during a repair operation, one of the first and second sub-memory blocks is repaired.

* * * * *

UNITED STATES PATENT AND TRADEMARK OFFICE
CERTIFICATE OF CORRECTION

PATENT NO. : 7,315,472 B2 Page 1 of 1
APPLICATION NO. : 11/420367
DATED : January 1, 2008
INVENTOR(S) : Hee Youl Lee It is certified that error appears in the above-identified patent and that said Letters Patent is hereby corrected as shown below:

At Column 7, line 37, "read and," should be -- read, and --.

At Column 8, line 31, "read and," should be -- read, and --.

Signed and Sealed this

First Day of July, 2008

JON W. DUDAS
*Director of the United States Patent and Trademark Office*